(12) United States Patent
Senba

(10) Patent No.: US 6,545,508 B2
(45) Date of Patent: Apr. 8, 2003

(54) DETECTION OF CLOCK SIGNAL PERIOD ABNORMALITIES

(75) Inventor: Hisanori Senba, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/066,508

(22) Filed: Jan. 31, 2002

(65) Prior Publication Data

US 2002/0118046 A1 Aug. 29, 2002

(30) Foreign Application Priority Data

Feb. 23, 2001 (JP) ........................................ 2001-048354

(51) Int. Cl.⁷ ............................................... H03K 3/013

(52) U.S. Cl. ......................................... 327/20; 327/292

(58) Field of Search ............................ 327/18, 20, 26, 327/141, 142, 161, 166, 172, 176, 218, 225, 263, 292, 299

(56) References Cited

U.S. PATENT DOCUMENTS

| | | | |
|---|---|---|---|
| 4,864,574 A | * 9/1989 | Pritt | 714/814 |
| 5,463,655 A | * 10/1995 | Llewellyn | 375/359 |
| 5,619,155 A | 4/1997 | Wang | 327/142 |
| 5,761,446 A | * 6/1998 | Donley et al. | 710/107 |
| 6,008,671 A | * 12/1999 | Kang | 327/20 |
| 6,034,554 A | * 3/2000 | Francis et al. | 327/7 |
| 6,324,652 B1 | * 11/2001 | Henderson et al. | 713/500 |
| 6,469,549 B2 | * 10/2002 | Carson et al. | 327/115 |

FOREIGN PATENT DOCUMENTS

SU    1 798 919 A    2/1993

OTHER PUBLICATIONS

Patent Abstracts of Japan, vol. 1998, No. 7, d. Mar. 31, 1998 and JP 09 016281 A (United Microelectron Corp.) Jan. 17, 1997.
"Device for Overclock Detection and Marking", Research Disclosure, Kenneth Mason Publications, Hampshire, G.B., No. 432, Apr., 2000, p. 692 XP 000968874.
Database WPI: Section EI Week 199840, Derwent Publications., Ltd., London, G.B., Class U21, AN 1998–465910 XP002198097 & RU 2 105 411 C (Nuclear Center Exper Phys. Res. Inst.), Feb. 20, 1998 Abstract.
Database WPI: Section EI Week 198202, Derwent Publications, Ltd., London, G.B., Class T01, AN 1982–A4275E XP002198098 & SU 817 717 A (Dzhagarov Yu A.), Mar. 30, 1981 Abstract.

* cited by examiner

*Primary Examiner*—My-Trang Nu Ton
(74) *Attorney, Agent, or Firm*—Scully, Scott, Murphy & Presser

(57) ABSTRACT

A clock monitoring circuit is disclosed for detecting that the period of a clock signal has become shorter than a predetermined time interval. The clock monitoring monitoring circuit comprises a first and second flip-flop circuits that are D-type flip-flops, a delay circuit, and a gate circuit. The second flip-flop circuit receives as an input signal the output signal of the first flip-flop circuit. The output signal of the second flip-flop circuit is delayed a fixed time interval by the delay circuit and then supplied as an input signal to the first flip-flop circuit. The delay time of the delay circuit is set to be equal to the previously described predetermined period. The gate circuit receives the output signals of the first and second flip-flop circuits, and provides a signal whose logic level when the period of the received clock signal is the predetermined period differs from that when it is shorter than the predetermined period. The fact that the period of the clock signal has become shorter than the predetermined period can thus be detected.

9 Claims, 4 Drawing Sheets

_US 6,545,508 B2_

DETECTION OF CLOCK SIGNAL PERIOD ABNORMALITIES

BACKGROUND OF THE INVENTION

1. Field of the Invention

The present invention relates to a clock monitoring circuit for detecting that the period of a clock signal has become shorter than a predetermined permissible range.

2. Description of the Related Art

Processors that operate in synchronization with a clock signal generated by a clock generating circuit and that execute various types of processing are currently implemented, for example, in the form of MPUs (Micro Processing Units). Processors such as MPUs are designed to operate in synchronization with a clock signal of a predetermined period and are therefore subject to overrunning when the period of this clock signal has become shorter than the predetermined period.

SUMMARY OF THE INVENTION

It is an object of the present invention to provide a clock monitoring circuit that can easily and accurately detect that the period of a clock signal has become shorter than a predetermined period.

It is another object of the present invention to provide a data processing device that is equipped with the above-described clock monitoring circuit and that can prevent overrunning of a processing circuit when the period of the clock signal has become shorter than the predetermined period.

In order to achieve the above-described objects, the clock monitoring circuit of the present invention comprises first and second flip-flop circuits, a delay means, and a gate circuit. The first and second flip-flop circuits are D-type flip-flops that latch input signals in synchronization with the rising edge or falling edge of a clock signal.

The second flip-flop circuit receives as an input signal the output signal of the first flip-flop circuit. The output signal of the second flip-flop circuit is delayed a fixed time period by the delay means and then supplied as an input signal to the first flip-flop circuit. The delay time of the delay means is set to be equal to the previously described predetermined period.

The gate circuit is constructed such that it receives the output signals of the first and second flip-flop circuits and provides an output signal whose logic level depends on whether the period of the input clock signals is the predetermined period or not. A shortening of the period of the clock signal can thus be detected according to the logic level of the output signal of the clock monitoring circuit.

A data processing device according to the present invention includes the aforementioned clock monitoring circuit. When an abnormality in the clock signal is detected by the clock monitoring circuit, this abnormality is communicated to an operation control circuit that controls the operation of the processor, halting the operation of the processor.

Overrunning in the processing circuit due to abnormalities of the clock signal can thus be stopped.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 1:
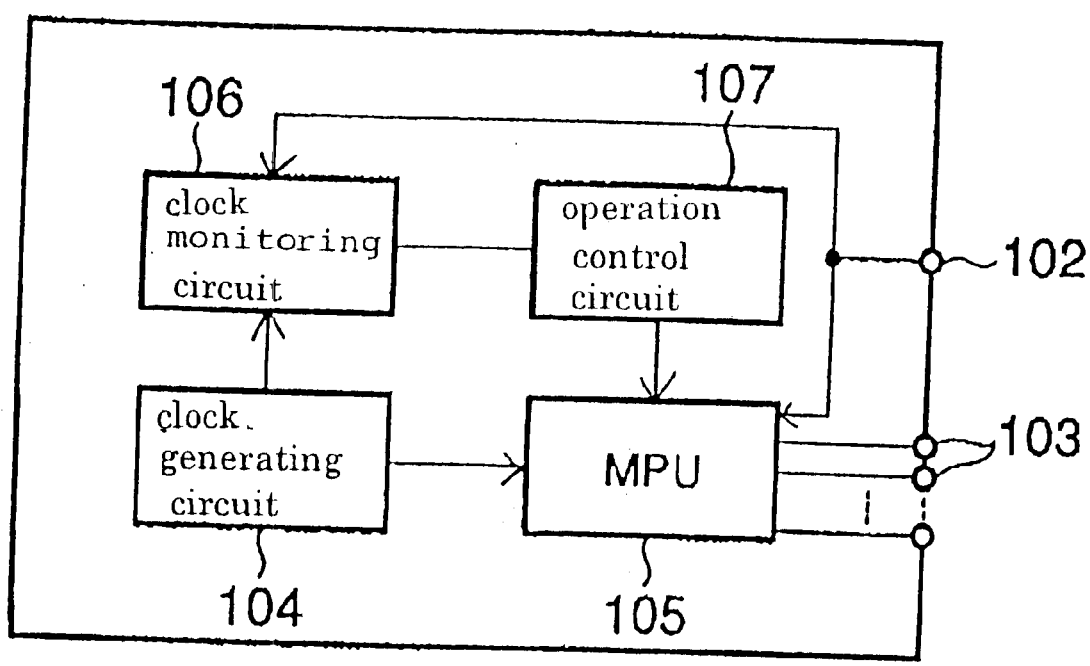
FIG. 1 is a block diagram of a data processing device according to an embodiment of the present invention.

Referring now to FIG. 1, there is shown a data processing device according to an embodiment of the present invention that includes reset input terminal 102, a plurality of data input/output terminals 103, clock generating circuit 104, MPU 105 which executes data processing, clock monitoring circuit 106, and operation control circuit 107.

Reset input terminal 102 is connected to MPU 105 and clock monitoring circuit 106. Data input/output terminal 103 is connected to MPU 105. MPU 105 is further connected to clock generating circuit 104 and operation control circuit 107. Clock monitoring circuit 106 is also connected to clock generating circuit 104 and operation control circuit 107.

Clock generating circuit 104 is provided with, for example, a crystal oscillator (not shown), and generates a clock signal of a predetermined period T. A computer program for executing processing, i.e., software or firmware, is installed in MPU 105, and MPU 105 executes processing in synchronization with the clock signal generated by clock generating circuit 104.

In other words, MPU 105 executes processing in accordance with the various types of data that are supplied from data input/output terminals 103, and outputs the data resulting from this processing from data input/output terminals 103. Accordingly, the data processor can communicate with an outside apparatus (not shown) by way of data input/output terminals 103, and can execute various types of data processing in accordance with this communication.

When a reset signal is applied as input to reset input terminal 102, the reset signal is applied to MPU 105 and clock monitoring circuit 106, whereby MPU 105 and clock monitoring circuit 106 are reset.

Clock monitoring circuit 106 monitors the period of the clock signal generated by clock generating circuit 104. When the period of the clock signal becomes shorter than a predetermined reference time interval, clock monitoring circuit 106 provides a clock abnormality signal to operation control circuit 107. When operation control circuit 107 receives the clock abnormality signal from clock monitoring circuit 106, it forcibly halts the processing performed by MPU 105.

Figure 2:
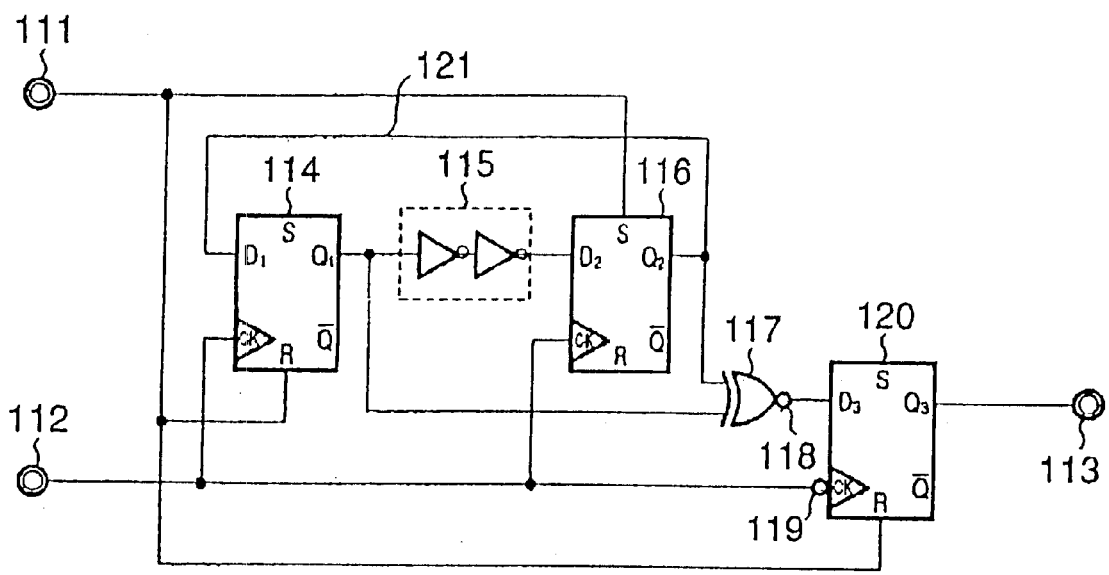
FIG. 2 is a circuit diagram showing the construction of the clock monitoring circuit shown in FIG. 1.

Referring now to FIG. 2, the clock monitoring circuit of this embodiment comprises reset input terminal 111, clock input terminal 112, signal output terminal 113, flip-flop (hereinafter abbreviated to FF) circuit 114, signal delay circuit 115, FF circuit 116, exclusive-OR circuit 117, inverter element 118, inverter element 119, and FF circuit 120.

Reset input terminal 111 is connected to the reset terminal of FF circuit 114, the set terminal of FF circuit 116, and the reset terminal of FF circuit 120. Clock input terminal 112 is connected to the clock terminals of FF circuit 114 and FF circuit 116, and to the clock terminal of FF circuit 120 by way of inverter element 119. The signal input terminal of FF circuit 114 and the signal output terminal of FF circuit 116 are connected each other through feedback signal 121. In addition, the signal output terminal of FF circuit 114 and the signal input terminal of FF circuit 116 are connected by way of signal delay circuit 115.

The signal output terminals of FF circuit 114 and FF circuit 116 are each connected to a respective signal input terminal of exclusive-OR circuit 117. The signal output terminal of exclusive-OR circuit 117 is connected to the signal input terminal of FF circuit 120 by way of inverter element 118. The signal output terminal of FF circuit 120 is connected to signal output terminal 113, and signal output terminal 113 is connected to operation control circuit 107 (FIG. 1).

FF circuit 114 is reset by the reset signal. FF circuit 114 receives output signal $Q_2$ of FF circuit 116 as input signal $D_1$, latches input signal $D_1$ at the rising edge of input clock signal CLK, and provides output signal $Q_1$ as input to signal delay circuit 115.

Signal delay circuit 115 is made up of two inverter elements that are connected in series. Signal delay circuit 115 delays output signal $Q_1$ of FF circuit 114 by a predetermined time interval, and provides as input signal $D_2$ to FF circuit 116. This delay time must be set shorter than the period of the normal clock signal and longer than the minimum period of the clock signal at which MPU 105 can operate normally.

FF circuit 116 is set by the reset signal, receives input signal $D_2$, latches input signal $D_2$ at the rising edge of received clock signal CLK, and provides output signal $Q_2$ as output. Output signal $Q_2$ is supplied as input signal $D_1$ to FF circuit 114. Exclusive-OR circuit 117 exclusively ORs output signal Q1 of FF circuit 114 with output signal $Q_2$ of FF circuit 116 and provides the resultant signal as an output. Inverter element 118 inverts the output signal of exclusive-OR circuit 117 and provides the resultant signal as input signal $D_3$ to FF circuit 120.

FF circuit 120 is reset by the reset signal, receives input signal $D_3$ that is output from inverter 118, latches input signal $D_3$ at the rising edge of clock signal CLK that was inverted by inverter element 119, and provides output signal $Q_3$ as an output. Output signal $Q_3$ of FF circuit 120 is supplied to operation control circuit 107 by way of signal output terminal 113.

Figure 3:
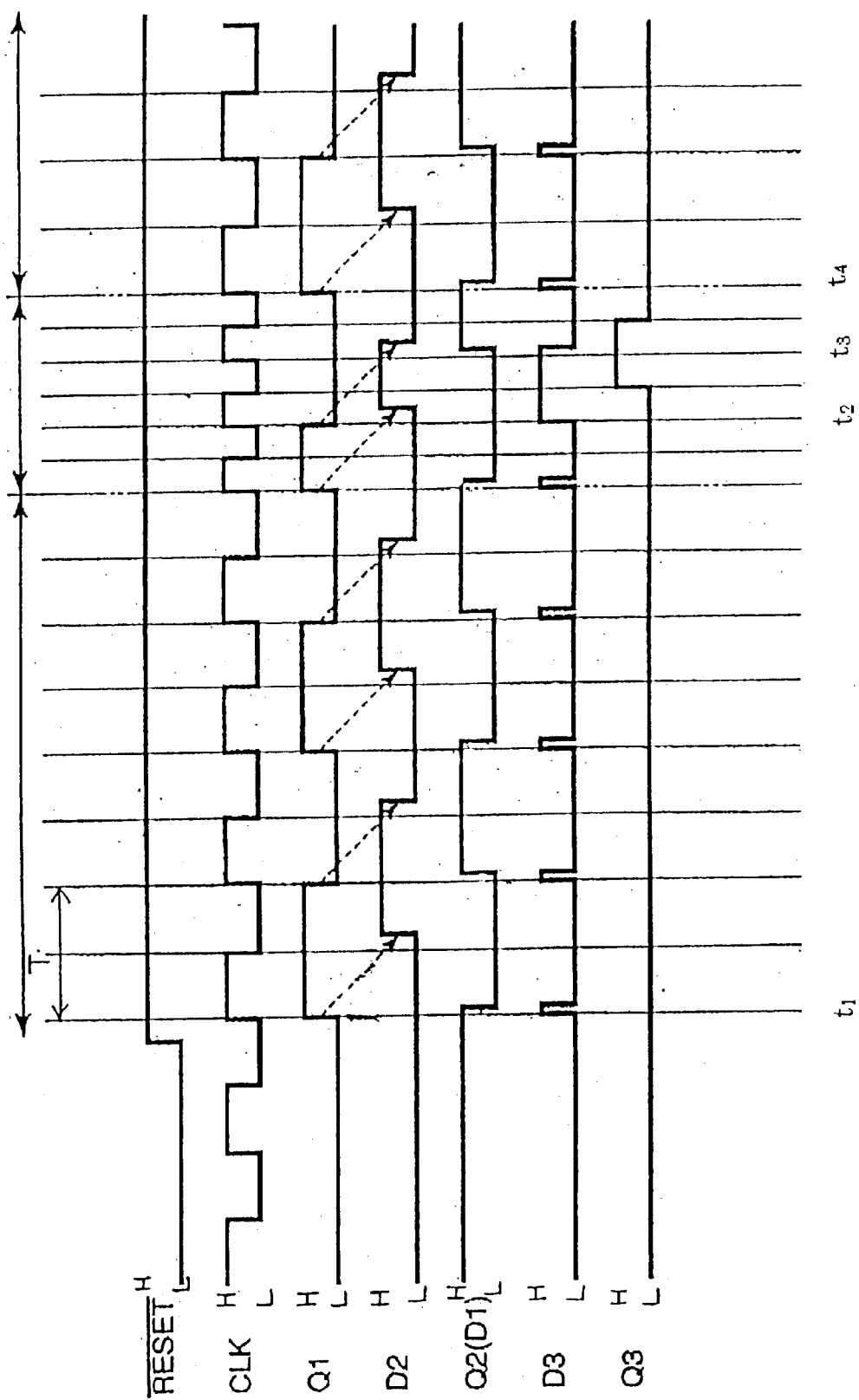
FIG. 3 is a timing chart showing the operation of the clock monitoring circuit shown in FIG. 2.

The operation of this embodiment will next be described with reference to FIG. 3. Upon receipt of a clock signal of a predetermined period T at clock input terminal 112 at time $t_1$, output signal $Q_2$ (input signal $D_1$) of FF circuit 116 is latched by FF circuit 114 at the rising edge of clock signal CLK and generated as output signal $Q_1$.

Output signal $Q_1$ of FF circuit 114 is delayed a predetermined time interval by signal delay circuit 115. FF circuit 116 receives the delayed signal, i.e., input signal $D_2$, latches input signal $D_2$ at the rising edge of clock signal CLK, and provides the signal as output signal $Q_2$.

If the period of clock signal CLK is longer than the delay time of signal delay circuit 115, output signal $Q_1$ of FF circuit 114 becomes a signal that is the inverted logic of output signal $Q_2$ of FF circuit 116, and output signal $Q_2$ of FF circuit 116 becomes a signal that is the inverted logic of output signal $Q_1$ of FF circuit 114. Accordingly, the output signal of exclusive OR circuit 117 maintained at low logical level.

If the operation of FF circuit 114 and the operation of FF circuit 116 are not synchronized with complete accuracy, however, spike noise occurs in output signal $D_3$ of exclusive-OR circuit 117 even if the period of clock signal CLK is longer than the delay time of signal delay circuit 115.

In the clock monitoring circuit of the embodiment, however, FF circuit 120 receives, as input signal $D_3$, the output signal of exclusive-OR circuit 117 that has been inverted by inverter element 118, and by matching the logic level of output signal $Q_3$ with the logic level of input signal $D_3$ at the rising edge of clock signal CLK that is inverted by inverter element 119, the spike noise that occurs in output signal $D_3$ of exclusive-OR circuit 117 due to the timing error between FF circuit 114 and FF circuit 116 is eliminated.

If the period of clock signal CLK is shorter than the delay time of signal delay circuit 115 at time $t_2$, output signal $Q_1$ of FF circuit 114 and output signal $Q_2$ of FF circuit 116 both go low between time $t_2$ and time $t_3$. Input signal $D_3$ of FF circuit 120 goes accordingly high. Output signal $Q_3$ also goes high, and a clock abnormality signal is transmitted as output from output terminal 113 to operation control circuit 107. Operation control circuit 107 receives the clock abnormality signal and forcibly halts the operation of MPU 105, thereby reliably preventing overrunning of MPU 105.

When the period of clock signal CLK returns to T at time t4, clock monitoring circuit 106 operates as previously described.

In clock monitoring circuit 106 of the present embodiment, moreover, since signal delay circuit 115 is constituted by logic circuits, the delay time of signal delay circuit 115 does not vary in analog fashion, and since the clock monitoring circuit itself is constituted by digital circuits, clock monitoring circuit 106 is capable of stable operation.

The present invention is not limited to the above-described embodiment, and allows various modifications within the scope of the invention. Although signal delay circuit 115 is constituted by logic circuits and clock monitoring circuit 106 is constituted entirely by digital circuits in the above-described embodiment, an analog signal delay circuit composed of, for example, resistors and capacitors or a signal delay circuit made up of a long wiring may also be used.

Figure 4:
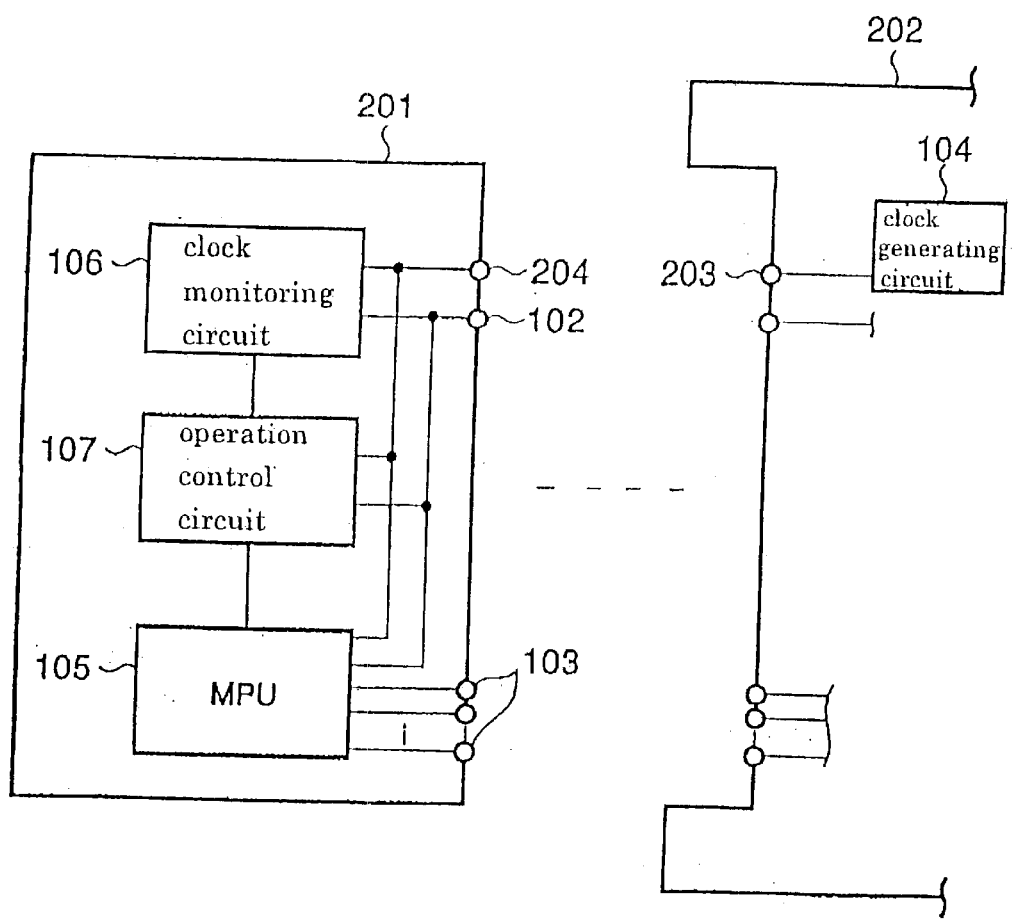
FIG. 4 is a block diagram showing the construction of a data processing system as an application of the present invention.

Furthermore, although a case has been described in the present embodiment in which a data processor incorporates a clock generating circuit, data processing system 200 may be constructed which includes data processor 201 that does not incorporate a clock generating circuit, as shown in FIG. 4.

Data processing system 200 comprises parent device 202 which can be equipped with data processor 201 as a subordinate device, and parent device 202 comprises clock generating circuit 104 and clock output terminal 203. Data processor 201 is equipped with clock input terminal 204, and clock input terminal 204 and clock output terminal 203 are connected when data processor 201 is equipped with parent device 202.

The clock signal generated by clock generating circuit 104 of parent device 202 is supplied from clock output terminal 203 to clock input terminal 204 of data processor 201, and each of portions 105–107 of data processing device 201 operate in synchronization with the clock signal.

As described previously, a clock signal is supplied from parent device 202 to data processor 201 in data processing system 200. With such configuration, however, data processor 201 can accept parent devices of a variety of standards, and a clock signal having a period that is shorter than the predetermined period may be supplied to data processor 201. To avoid this, data processing device 201 comprises clock monitoring circuit 106 and operation control circuit 107, thereby preventing overrunning of MPU 105.

Although FF circuit 114 and FF circuit 116 are designed to operate at the rising edge of clock signal CLK and FF circuit 120 is designed to operate at the falling edge of clock signal CLK in clock monitoring circuit 106 of this embodiment, FF circuit 114 and FF circuit 116 may be designd to operate at the falling edge of clock signal CLK and FF circuit 120 may be designed to operate at the rising edge of clock signal CLK. In addition, inverted output signals $\overline{Q}$ may be used as the output signals of FF circuit 114, FF circuit 116, and FF circuit 120, respectively, instead of output signals $Q_1$, $Q_2$, and $Q_3$.

While preferred embodiments of the present invention have been described using specific terms, such description is for illustrative purposes only, and it is to be understood that changes and variations may be made without departing from the spirit or scope of the following claims.

What is claimed is:

1. A clock monitoring circuit comprising:

a first flip-flop circuit for latching and outputting an input signal when a given transition of a clock signal occurs between its two logic levels;

a second flip-flop circuit for latching and outputting the output signal of said first flip-flop circuit when a given transition of said clock signal occurs between its two logic levels;

a delay means for delaying the output signal of said second flip-flop circuit by a time interval that is shorter than a predetermined period of said clock signal and outputting the resultant signal as an input signal to said first flip-flop circuit; and a gate circuit for receiving the output signal of said first flip-flop circuit and the output signal of said second flip-flop circuit, and for outputting a signal of a first logic level when the period of said clock signal is equal to or greater than said predetermined time interval, and outputting a signal of a second logic level when the period of said clock signal is shorter than said predetermined time interval.

2. A circuit according to claim 1, further comprising a third flip-flop circuit for latching the output signal of said gate circuit at a timing that is delayed from the latch of said second flip-flop circuit when a given transition of said clock signal occurs between its two logic levels.

3. A circuit according to claim 1, wherein said delay means comprises logic circuits.

4. A circuit according to claim 1, wherein:

the positive output terminal of said first flip-flop circuit is connected to the input terminal of said second flip-flop circuit, and the input terminal of said delay means is connected to the positive output terminal of said second flip-flop circuit; and said gate circuit is an exclusive-OR circuit that exclusively ORs the output signal of the positive output terminal of said first flip-flop circuit with the output signal of the positive output terminal of said second flip-flop circuit.

5. A circuit according to claim 3, wherein said delay means comprises a plurality of inverter elements connected in series.

6. A circuit according to claim 4, further comprising a third flip-flop circuit for latching and outputting eithrer the output signal of said exclusive-OR circuit or the inverted signal of the output signal of said exclusive-OR circuit, at a timing that is delayed from the latch of said second flip-flop circuit when a given transition of said clock signal occurs between its two logical levels.

7. A data processing device, comprising:

a processor for performing predetermined processing in synchronization with a clock signal;

a clock monitoring circuit for detecting that the period of said clock signal has become shorter than a predetermined period and outputting a clock abnormality signal; and an operation control circuit for, in response to said clock abnormality signal, halting the operation of said processor.

8. A device according to claim 7, wherein said clock monitoring circuit comprises:

a first flip-flop circuit for latching and outputting an input signal when a given transition of a clock signal occurs between its two logic levels;

a second flip-flop circuit for latching and outputting the output signal of said first flip-flop circuit when a given transition of said clock signal occurs between between its two logic levels;

a delay means for delaying the output signal of said second flip-flop circuit by a time interval that is shorter than a predetermined period of said clock signal and outputting the resultant signal as an input signal to said first flip-flop circuit; and a gate circuit for inputting the output signal of said first flip-flop circuit and the output signal of said second flip-flop circuit, and for outputting a signal of a first logic level when the period of said clock signal is equal to or greater than said predetermined time interval, and outputting a signal of a second logic level when the period of said clock signal is shorter than said predetermined time interval.

9. A device according to claim 7, further comprising a clock generating circuit for generating said clock signal.

* * * * *